(12) United States Patent
Wang et al.

(10) Patent No.: US 6,592,776 B1
(45) Date of Patent: Jul. 15, 2003

(54) POLISHING COMPOSITION FOR METAL CMP

(75) Inventors: Shumin Wang, Naperville, IL (US); Steven K. Grumbine, Aurora, IL (US); Christopher C. Streinz, Patten, ME (US); Eric W. G. Hoglund, Algonquin, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 09/609,882

(22) Filed: Jul. 5, 2000

Related U.S. Application Data

(63) Continuation-in-part of application No. 09/086,659, filed on May 29, 1998, now Pat. No. 6,136,711, which is a continuation-in-part of application No. 08/901,803, filed on Jul. 28, 1997, now Pat. No. 6,083,419.

(51) Int. Cl.$^7$ ............................................. C09K 13/00
(52) U.S. Cl. .................... 252/79.1; 252/79.2; 252/79.3; 252/79.4
(58) Field of Search ............................... 252/79.1, 79.2, 252/79.3, 79.4

(56) References Cited

U.S. PATENT DOCUMENTS

| | | | |
|---|---|---|---|
| 4,563,483 A | 1/1986 | Smith et al. | |
| 4,968,381 A * | 11/1990 | Prigge et al. | ................ 156/636 |
| 5,645,736 A | 7/1997 | Allman | |
| 5,759,917 A | 6/1998 | Grover et al. | |
| 5,767,016 A | 6/1998 | Muroyama | |
| 5,783,489 A | 7/1998 | Kaufman et al. | |
| 5,954,997 A | 9/1999 | Kaufman et al. | |
| 5,980,775 A | 11/1999 | Grumbine et al. | |
| 5,985,288 A | 11/1999 | Munson, Jr. et al. | |
| 5,993,686 A | 11/1999 | Streinz et al. | |
| 6,015,506 A | 1/2000 | Streinz et al. | |
| 6,033,596 A | 3/2000 | Kaufman et al. | |
| 6,039,891 A | 3/2000 | Kaufman et al. | |
| 6,062,968 A | 5/2000 | Sevilla et al. | |
| 6,063,306 A | 5/2000 | Kaufman et al. | |
| 6,068,787 A | 5/2000 | Grumbine et al. | |
| 6,083,419 A * | 7/2000 | Grumbine et al. | ......... 252/79.1 |
| 6,194,317 B1 * | 2/2001 | Kaisaki et al. | .............. 438/692 |
| 6,225,223 B1 * | 5/2001 | Liu et al. | .................... 438/687 |
| 6,299,659 B1 * | 10/2001 | Kido et al. | ................... 51/309 |

FOREIGN PATENT DOCUMENTS

| | | | |
|---|---|---|---|
| EP | 0 896 042 A | | 2/1999 |
| JP | 08-113772 | * | 5/1996 |
| JP | 10-180619 | * | 7/1998 |
| WO | WO 98 49723 A | | 11/1998 |

* cited by examiner

Primary Examiner—George Goudreau

(57) ABSTRACT

Chemical mechanical polishing compositions and slurries comprising a film forming agent and at least one silane compound wherein the compositions are useful for polishing substrate features such as copper, tantalum, and tantalum nitride features.

20 Claims, No Drawings

POLISHING COMPOSITION FOR METAL CMP

This application is a continuation-in-part of U.S. patent application Ser. No. 09/086,659 filed on May 29, 1998, now U.S. Pat. No. 6,136,711 which in turn is a continuation-in-part of U.S. patent application Ser. No. 08/901,803, filed on Jul. 28, 1997, now U.S. Pat. No. 6,083,419.

BACKGROUND OF THE INVENTION

(1) Field of the Invention

This invention concerns aqueous chemical mechanical polishing compositions and slurries that are useful for polishing substrates including metal features such as copper and tantalum features. The aqueous polishing compositions comprise a film forming agent and at least one silane composition. In one method, the polishing compositions of this invention are used by applying the composition to an abrasive pad or by combining the composition with one or more abrasives to form a polishing slurry and then using the pad or slurry to polish a substrate including one or more metal features.

(2) Description of the Art

Integrated circuits are made up of millions of active devices formed in or on a silicon substrate. The active devices, which are initially isolated from one another, are interconnected to form functional circuits and components. The devices are interconnected through the use of multilevel interconnections. Interconnection structures normally have a first layer of metallization, an interconnection layer, a second level of metallization, and sometimes a third and subsequent level of metallization. Interlevel dielectrics such as doped and undoped silicon dioxide ($SiO_2$), or low-κ dielectrics tantalum nitride are used to electrically isolate the different levels of metallization in a silicon substrate or well. The electrical connections between different interconnection levels are made through the use of metallized vias. U.S. Pat. No. 5,741,626, which is incorporated herein by reference, describes a method for preparing dielectric tantalum nitride layers.

In a similar manner, metal contacts are used to form electrical connections between interconnection levels and devices formed in a well. The metal vias and contacts may be filled with various metals and alloys including titanium (Ti), titanium nitride (TiN), tantalum (Ta), aluminum copper (Al—Cu), aluminum silicon (Al—Si), copper (Cu), tungsten (W), and combinations thereof. The metal vias and contacts generally employ an adhesion layer such as titanium nitride (TiN), titanium (Ti), Tantalum (Ta), Tantalum nitride (TaN) or combinations thereof to adhere the metal layer to the $SiO_2$ substrate. At the contact level, the adhesion layer acts as a diffusion barrier to prevent the filled metal and $SiO_2$ from reacting.

In many semiconductor manufacturing processes, metallized vias or contacts are formed by a blanket metal deposition followed by a chemical mechanical polish (CMP) step. In a typical process, via holes are etched through an interlevel dielectric (ILD) to interconnection lines or to a semiconductor substrate. Next, a thin adhesion layer such as tantalum nitride and/or tantalum is generally formed over the ILD and is directed into the etched via hole. Then, a metal film is blanket deposited over the adhesion layer and into the via hole. Deposition is continued until the via hole is filled with the blanket deposited metal. Finally, the excess metal is removed by chemical mechanical polishing, (CMP) to form metal vias. Processes for manufacturing and/or CMP of vias are disclosed in U.S. Pat. Nos. 4,671,851, 4,910,155 and 4,944,836.

In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a "slurry" is applied to the pad during polishing. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed. Polishing composition formulation is an important factor in the CMP step. The polishing composition should be tailored to provide effective polishing to metal layers at desired polishing rates while minimizing surface imperfections, defects and corrosion and erosion. Furthermore, the polishing composition may be used to provide controlled polishing selectivities to other thin-film materials used in current integrated circuit technology such as titanium, titanium nitride, tantalum, tantalum nitride, and the like.

There are various mechanisms disclosed in the prior art by which metal surfaces can be polished with slurries. The metal surface may be polished using a slurry in which a surface film is not formed in which case the process proceeds by mechanical removal of metal particles and their dissolution in the slurry. In such a mechanism, the chemical dissolution rate should be slow in order to avoid wet etching. A more preferred mechanism is, however, one where a thin abradable layer is continuously formed by reaction between the metal surface and one or more components in the slurry such as a complexing agent and/or a film forming layer. The thin abradable layer is then removed in a controlled manner by mechanical action. Once the mechanical polishing process has stopped a thin passive film remains on the surface and controls the wet etching process. Controlling the chemical mechanical polishing process is much easier when a CMP slurry polishes using this mechanism.

Current copper containing substrates that are polished using chemical mechanical polishing also use Ta and TaN adhesion layers. Ta and TaN are chemically very passive and mechanically very hard and thus difficult to remove by polishing. Thus, there remains a need for polishing compositions that are useful for polishing substrates including tantalum while having little detrimental effect on previously polished copper features.

SUMMARY OF THE INVENTION

In one embodiment, this invention includes aqueous chemical mechanical polishing compositions comprising a film forming agent and at least one silane compound.

In another embodiment, this invention includes an aqueous chemical mechanical polishing compositions comprising from about 0.01 to about 0.5 wt % benzotriazole and from about 0.05 to about 1.0 wt % uriedopropyltrimethoxysilane and further optionally including from about 1.0 to about 30 wt % silica abrasive.

In yet another embodiment, this invention is a method for polishing a substrate feature. The method includes moving a substrate including at least one feature into contact with a polishing pad. Next, the substrate is moved in relationship to the polishing pad to remove a portion of the substrate feature. A liquid polishing composition is applied to the polishing pad to promote polishing wherein the liquid polishing composition comprises at least one film forming agent and at least 0.001 wt % of at least one silane compound.

The polishing compositions of the present invention have been found to be effective in polishing the metal features of an integrated circuit with few defects.

DESCRIPTION OF THE CURRENT EMBODIMENT

The present invention relates to chemical mechanical polishing compositions and to methods for using the compositions to polish a substrate including a metal portion at acceptable rates and with very few defects.

Before describing the details of the various preferred embodiments of this invention, some of the terms that are used herein will be defined. The term "chemical mechanical polishing composition" refers to aqueous polishing compositions that do not include abrasive materials. The polishing compositions can be combined with a polishing pad with or without an abrasive to polish substrates. Alternatively, the chemical mechanical polishing compositions of this invention can be combined with a particulate abrasive to form a chemical mechanical polishing (CMP) slurry. The chemical mechanical polishing compositions and CMP slurries are useful for polishing a multiple level metallizations which may include but are not limited to semi-conductor thin-films, integrated circuit thin-films, and for any other films and surfaces where CMP processes are useful.

The terms "copper" and "copper containing alloys" are used interchangeably herein as it is within the understanding of one of skill in the art that the terms include but are not limited to substrates comprising layers of pure copper, copper aluminum alloys, and Ti/TiN/Cu, and Ta/TaN/Cu multi-layer substrates.

The term "substrate feature" as it is used herein refers to electronic substrate features such as vias and copper interconnect lines, and to layers of materials deposited on or in the features such as dielectric layers, low-k material layers, adhesion layers, metal layers, and so forth. The polishing compositions of this invention are useful for polishing substrates to remove material layers, as well as for polishing exposed substrate features.

The chemical mechanical polishing compositions of this invention include at least one film forming agent. The film forming agent may be any compound or mixtures of compounds that are capable of chemically binding to the surface of a substrate feature to form a chemical complex wherein the chemical complex is not a metal oxide or hydroxide. The chemical complex acts as a passivation layer and inhibits the dissolution of the surface metal layer of the substrate metal feature. Useful film forming agents are nitrogen containing cyclic compounds such as imidazole, benzotriazole, benzimidazole and benzothiazole and their derivatives with hydroxy, amino, imino, carboxy, mercapto, nitro and alkyl substituted groups, as well as urea, thiourea and others. A more preferred film forming agent is benzotriazole ("BTA"). It is preferred that the film forming agent selected is one that is capable of forming a passivation layer on substrate copper features. The film forming agent may be present in the polishing compositions and slurries of this invention in an amount ranging from about 0.01 weight percent to about 1.0 weight percent. It is preferred that film forming agent is present in the polishing compositions and slurries of this invention in an amount ranging from about 0.01 to about 0.5 weight percent.

The polishing compositions and slurries of this invention include at least one silane compound in solution. General classes of silane compounds useful in polishing compositions on this invention include aminosilanes, uriedosilanes, alkoxysilanes, alkylsilanes, mercaptosilanes, thiocyanatosilanes, vinylsilanes, methacrylsilanes, cyanosilanes, functionalized silanes, disilanes, trisilanes and combinations thereof.

Preferred silane compositions have the formula:

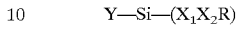

$Y-Si-(X_1X_2R)$ and include dimers, trimers and oligomers thereof wherein the term "oligomers" refers to a compound containing from 4 to 15 siloxane units. In the formulas above, Y, R, $X_1$, and $X_2$ may each be individually selected from hydroxy (—OH) or some other hydrolyzable substituent or a non-hydrolyzable substituent. More preferably, in the formula above, Y is hydroxy (—OH) or a hydrolyzable substituent, $X_1$ and $X_2$ are each independently selected from hydroxy, a hydrolyzable substituent, or a non-hydrolyzable substituent, and R is a non-hydrolyzable substituent. In a preferred embodiment the silane composition will have the formula above wherein Y is hydroxy (—OH) or a hydrolyzable substituent, R is a non-hydrolyzable substituent; and $X_1$ and $X_2$ are each individually non-hydrolyzable substituents.

Generally, "hydrolyzable" substituents are those compounds that will form Si(OH) in an aqueous system. Such moieties include, but are not limited to alkoxide, halogens such as Cl, carboxylate, and amides. Non-hydrolyzable moieties are any compounds that do not undergo hydrolysis to form Si(OH) in an aqueous solution.

The non-hydrolyzable substituents are each independently selected from alkyl, cycloalkyl, aromatic, functionalized alkyl, functionalized aromatic, functionalized cycloalkyl, alkene, alkylsilane, one or more of which carbon atoms may be substituted with one or more atoms selected from oxygen, nitrogen, sulfur, phosphorous, halogen, silicon, and combinations thereof wherein each non-hydrolyzable substituent include from 1 to 100 carbon atoms and preferably 2 to 25 carbon atom and most preferably 2 to 10 carbon atoms.

Preferably, each non-hydrolyzable substituent is selected from the group of compounds consisting of alkyl, functionalized alkyl, and mixtures thereof having from 2 to 25 carbon atoms. More preferably each non-hydrolyzable substituent is a functionalized alkyl selected from the group consisting of alkylnitriles, alkylamides, alkylcarboxylic acids, alkyl halide, alcohol, alkyluriedo, and mixtures thereof. Most preferably, at least one of the non-hydrolyzable substituents is functionalized propyl alkyl.

Examples of useful silane compounds include, but are not limited to silanes with three hydrolyzable substituents such as glycidoxypropyltrialkoxysilane, isocyanatopropyltrialkoxysilane, ureidopropyltrialkoxysilane, mercaptopropyltrialkoxysilane, cyanoethyltrialkoxysilane, 4,5-dihydro-1-(3-trialkoxysilylpropyl)imidazole, 3-(trialkoxysilyl)-methyl ester propanoic acid, trialkoxy[3-(oxiranylalkoxy)propyl]-silane, 2-methyl, 3-(trialkoxysilyl) propyl ester 2-propenoic acid, [3-(trialkoxysilyl)propyl] urea, and mixtures thereof. Silanes with two hydrolyzable substituents including chloropropylmethyldialkoxysilane, 1,2-ethanediylbis[alkoxydimethyl]silane, dialkoxymethylphenyl silane, and mixtures thereof. And silanes with a single hydrolyzable substituent such as cyanopropyldimethylalkoxysilane, N,N'-(alkoxymethylsilylene)bis[N-methyl-benzamide], chloromethyldimethylalkoxysilane, and mixtures thereof.

For purposes of this invention, the term "alkoxy" as used in the silane names above and as used generally herein refers to the hydrolyzable group and may include —OR, Cl, Br, I, NRR' wherein R and R' may include from 1 to 20.

The compositions and slurries of this invention will typically include from about 0.001 to 5.0 wt % silane. More preferably, the compositions of this invention will include from about 0.05 to about 1.0 wt % silane. The amount of silane in the compositions of this invention includes soluble silane that is in the polishing composition and slurry solutions as well as silanes that are associated with the surface of abrasive particles. Silane compositions including hydroxy or hydrolyazable moieties are capable of adhering to surface metal hydroxides found on many metal oxide abrasives. The term "soluble silane" as it is used herein refers to silanes that are present in the polishing compositions and slurries in a disassociated soluble form. The polishing compositions and slurries of this invention are liquid compositions that may include any solvents in which silanes can be solubilized or emulsified. Examples of useful solvents include polar solvents such as alcohols and water. Water is the preferred solvent of the polishing compositions and slurries of this invention. The compositions of this invention may include silanes dissolved in a solvent as well as silane/solvent emulsions.

Other well known polishing composition additives may be incorporated into the compositions and/or slurries of this invention. U.S. Pat. Nos. 6,136,711 and 6,083,419, the specifications of each of which are incorporated herein by reference describe several embodiments of compositions of this invention as well as polishing composition additives that can be optionally included in compositions of this invention. Non-limiting examples of useful polishing composition additives include, but are not limited to one or more oxidizing agents such as hydrogen peroxide, ammonium persulfate, and the like; complexing agents, surfactants; film forming agents such as benzotriazole; organic acids and inorganic acids; and/or salts such as sulfuric acid, phosphoric acid, phosphonic acid, nitric acid, HF acid, ammonium fluoride, ammonium salts, potassium salts, sodium salts or other cationic salts of sulfates, phosphates, phosphonates, and fluorides, acids and bases used to adjust composition pH. In essence, any ingredient that are known to be useful in chemical mechanical polishing slurries and compositions may be included in the polishing compositions and slurries of this invention.

The polishing compositions of this invention may also include an optional metal oxide abrasive selected from metal oxide abrasives including alumina, titania, zirconia, germania, silica, ceria, tantalum oxide ($TaO_x$), mixtures thereof, and chemical admixtures thereof. The term "chemical admixture" refers to particles including atomically mixed or coated metal oxide abrasive mixtures. A most preferred metal oxide abrasive is silica (silicon dioxide).

The abrasive particles useful in this invention may consist of metal oxide aggregates or individual single particles. The term "particle" as it is used herein refers to both aggregates of more than one primary particle and to single particles. Preferred metal oxide particles are silica and aluminum with silica being most preferred.

The metal oxide abrasives used in the present invention may be produced by any techniques known to those skilled in the art to give abrasive particles having the characteristics reported above. Metal oxide abrasives useful in this invention are derived from processes including flame processes, sol-gel processes, hydrothermal processes, plasma processes, aerogel processes, fuming processes, precipitation processes, mechanochemical milling, mining, and by any combination of these processes just so long as the abrasive includes surface metal hydroxides.

Generally, the metal oxide abrasives will be present in polishing slurries of this invention in an amount ranging from about 1 to about 30 wt %. More preferably, the abrasives will be present in the polishing slurries of this invention in an amount ranging from about 3 to about 15 wt % abrasive.

Alternatively, the polishing compositions of this invention may be used in conjunction with an abrasive containing polishing pad to polishing substrate metal features. The optional metal oxide abrasives may be produced by any techniques known to those skilled in the art such as sol-gel, hydrothermal or, plasma process, or by processes for manufacturing fumed or precipitated metal oxides. Preferably, the metal oxide is a fumed or precipitated abrasive and, more preferably it is a fumed abrasive such as fumed silica or fumed alumina with fumed silica being most preferred.

Preferably, the metal oxide abrasive is incorporated into the polishing composition as a concentrated aqueous dispersion of metal oxides, comprising from about 1% to about 45% solids, and preferably between 10% and 20% solids. The aqueous dispersion of metal oxides may be produced utilizing conventional techniques, such as slowly adding the metal oxide abrasive to an appropriate media, for example, deionized water, to form a colloidal dispersion. The dispersion is typically completed by subjecting it to high shear mixing conditions known to those skilled in the art. The pH of the slurry may be adjusted away from the isoelectric point to maximize colloidal stability.

BTA, or polishing additives included in polishing compositions may destabilize the uniform dispersion of abrasive in the slurry. In order to stabilize polishing slurries against settling, flocculation, and decomposition, a variety of optional polishing slurry additives, such as surfactants, stabilizers, or dispersing agents, can be used. If a surfactant is added to the polishing slurry, then it may be an anionic, cationic, nonionic, or amphoteric surfactant or a combination of two or more surfactants can be employed. Furthermore, it has been found that the addition of a surfactant may be useful to reduce the within-wafer-nonuniformity (WIWNU) of the wafers, thereby improving the surface of the wafer and reducing wafer defects.

In general, the amount of optional additives such as a surfactant that may be used in the polishing slurry should be sufficient to achieve effective stabilization of the slurry and will typically vary depending on the particular surfactant selected and the nature of the surface of the metal oxide abrasive. Stabilizers such as surfactants may be present in the polishing slurry in an amount ranging from about 0.001% to about 0.2% by weight, and preferably from about 0.001 to about 0.1 weight percent. Furthermore, the additive may be added directly to the slurry or treated onto the surface of the metal oxide abrasive utilizing known techniques. Examples of useful surfactants include dodecyl sulfate sodium salt, sodium lauryl sulfate, dodecyl sulfate ammonium salt, and mixtures thereof. Examples of useful surfactants include TRITON® DF-16 manufactured by Union Carbide, and SURFYNOL® manufactured by Air Products and Chemicals.

It is desirable to maintain the pH of the polishing compositions of this invention within a range of from about 3.0 to about 12.0, and preferably between from about 5.0 to about 12.0 in order to facilitate control of the CMP process. The pH of the polishing compositions of this invention may be adjusted using any known acid, base, or amine. However, the use of an acid or base that contains no metal ions, such as ammonium hydroxide and amines, or nitric, phosphoric, sulfuric, or organic acids are preferred to avoid introducing undesirable metal components into the CMP slurry of this invention.

The polishing composition of this invention may be used to polish any type of substrate feature. It is preferred that the polishing compositions of this invention are used to polish metal features since the compositions of this invention exhibit desirable low defectivity towards metal layers such as copper layer, while exhibiting a desirable adhesion layer, tantalum, tantalum nitride, or dielectric layer polishing rate. Examples of metals and dielectric materials that can be polished by the compositions of this invention include, but are not limited to, aluminum copper (Al—Cu), aluminum silicon (Al—Si), copper (Cu), tungsten (W), titanium nitride (TiN), titanium (Ti), tantalum (Ta), tantalum nitride (TaN), ultra low-k materials, silicon oxide, aluminum oxide, phosphorous, boron doped silica, or combinations thereof.

The polishing compositions and slurries of this invention may be used with any standard polishing equipment appropriate for use on the desired metal layer of the wafer. Polishing compositions of this invention are most useful for polishing substrates including either a tantalum or tantalum nitride portion and a copper alloy containing portion, both over a dielectric layer.

The polishing compositions are used to polish substrates by conventional means using conventional polishing machines. The polishing compositions of this invention may be applied directly to the substrate, they may be applied to a polishing pad, or they may be applied to both in a controlled manner during substrate polishing. It is preferred however that polishing compositions are applied to the pad which thereafter is brought into contact with the substrate surface after which the pad is moved in relationship to the substrate surface in order to achieve substrate polishing. Polishing compositions of this invention are then continuously or intermittently applied to the pad in order to maintain a sufficient amount of polishing composition at the pad/substrate surface. When the polishing end point is reached, the flow of polishing composition to the polishing pad is interrupted and excess polishing composition is washed from the substrate with deionized water or another solvent.

In one method of this invention, an abrasive free polishing composition including a soluble silanes and a film forming agent is applied to an abrasive-containing polishing pad and the wetted abrasive containing polishing pad is then used to polish substrate surface features. Alternatively, polishing slurries of this invention including soluble silanes, film forming agents and one or more abrasives may be applied to an abrasive containing polishing pad or to an abrasive-free polishing pad before and during substrate feature polishing. Examples of abrasive-containing polishing pads that can be used with the polishing compositions of this invention are disclosed in U.S. Pat. Nos. 5,849,051 and 5,849,052 the specification of which are incorporated herein by reference.

The polishing compositions of this invention are most useful in polishing metal substrate features and especially copper, titanium, titanium nitride, tantalum, and tantalum nitride features at various stages of semiconductor integrated circuit manufacture and provide effective polishing at desired polishing rates while minimizing surface imperfections and defects.

EXAMPLE 1

This example evaluates the ability of various polishing composition to polish tantalum layers without impacting the roughness of previously polished copper features. This example used CMP slurries including 6 wt % fumed silica having a surface area of 90 m$^2$/g. The slurry pH was maintained at 11 for all tests. Different ingredients were added to the base slurry as set forth in Table 1 below. Silquest A1524 is a commercially available uriedopropyltrimethoxysilane manufactured by CKWITCO Corporation. Each slurry was used to polish a Cu layer on wafer The copper surface roughness following polishing (a measure of defectivity) was determined using atomic force microscopy.

The Cu wafers were polished using an IPEC 472 polishing tool, with an IC1000/SUBA IV pad stack manufactured by Rodel. The wafers were polished using a 3 psi down force, a table speed of 55 rpm, a spindle speed of 30 rpm, and a slurry flow rate of 200 ml/min. The polishing results are reported in Table 1, below.

TABLE 1

| Slurry | Slurry Composition (Reported in wt %) | Cu roughness blanket/patterned (Å) |
|---|---|---|
| 1 | 6% fumed silica alone | 50 |
| 2 | 6% fumed silica 0.25% Silquest A1524, 0.04% BTA | 36/11 |
| 3 | 6% fumed silica 0.75% Silquest A1524, 0.04% BTA | 24 |
| 4 | 6% fumed silica 0.04% BTA | >40 |
| 5 | 6% silica 0.75% Silquest A1524 | >70 |

The polishing results in Table 1 demonstrate that slurries with abrasives alone produce wafers with rough copper surfaces (slurry 1). Adding either BTA or silane to the slurries improved copper roughness slightly (slurries 4 & 5), while adding both BTA and a silane improved copper roughness greatly, (slurries 2 & 3).

We claim:

1. A polishing composition comprising an aqueous solution of at least one film forming agent wherein the film forming agent is selected from imidazole, benzotriazole, benzimidiazole, benzothiazole that are optionally substituted with hydroxy, amino, imino, carboxy, mercapto, nitro and alkyl groups, urea, thiourea, or mixtures thereof, and at least 0.001 wt % of at least one silane compound.

2. The polishing composition of claim 1 wherein the film forming agent is benzotriazole.

3. The polishing composition of claim 1 including from about 0.01 to about 1.0 wt % film forming agent.

4. The polishing composition of claim 1 wherein the silane is in solution.

5. The polishing composition of claim 1 wherein the silane is selected from the group consisting of aminosilanes, uriedosilanes, alkoxysilanes, alkylsilanes, mercaptosilanes, thiocyanatosilanes, vinylsilanes, methacrylsilanes cyanosilanes, functionalized silanes, disilanes, trisilanes and combinations thereof.

6. The polishing composition of claim 1 wherein the silane has the following formula:

$$Y-Si-(X_1X_2R)$$

dimers, trimers and oligomers thereof wherein Y, R, $X_1$, and $X_2$ are each be individually selected from hydroxy (—OH), a hydrolyzable substituent or a non-hydrolyzable substituent.

7. The polishing composition of claim 6 wherein the silane is uriedopropyltrimethoxysilane.

8. The polishing composition of claim 1 including from about 0.001 to about 5.0 wt % silane.

9. The polishing composition of claim 1 further comprising at least one abrasive.

10. The polishing composition of claim 9 wherein at least a portion of the silane is bound to the abrasive.

11. The polishing composition of claim 9 wherein the abrasive is selected from alumina, titania, zirconia, germania, silica, ceria and mixtures thereof.

12. The polishing composition of claim 11 wherein the abrasive is silica.

13. The polishing composition of claim 9 wherein the abrasive is present in the composition in an amount ranging from about 1 to about 30 wt %.

14. A polishing composition comprising an aqueous solution including from about 0.01 to about 0.5 wt % benzotriazole and from about 0.05 to about 1.0 wt % uriedopropyltrimethoxysilane.

15. The polishing composition of claim 14 further including from about 1 to about 30 wt % silica abrasive.

16. The polishing composition of claim 6 wherein the silane is selected from glycidoxypropyltrialkoxysilane, isocyanatopropyltrialkoxysilane, ureidopropyltrialkoxysilane, mercaptopropyltrialkoxysilane, cyanoethyltrialkoxysilane, 4,5-dihydro-1-(3-trialkoxysilylpropyl)imidazole, 3-(trialkoxysilyl)-methyl ester propanoic acid, trialkoxy(3-(oxiranylalkoxy)propyl)-silane, 2-methyl, 3-(trialkoxysilyl) propyl ester 2-propenoic acid, (3-(trialkoxysilyl)propyl) urea, or mixtures thereof.

17. The polishing composition of claim 6 wherein the silane has two hydrolyzable substituents.

18. The polishing composition of claim 17 wherein the silane is selected from chloropropylmethyldialkoxysilane, 1,2-ethanediylbis(alkoxydimethyl)silane, dialkoxymethylphenyl silane, or mixtures thereof.

19. The polishing composition of claim 6 wherein the silane has a single hydrolyzable substituent.

20. The polishing composition of claim 19 wherein the silane is selected from cyanopropyldimethylalkoxysilane, N,N'-(alkoxymethylsilylene)bis(N-methyl-benzamide), chloromethyldimethylalkoxysilane, or mixtures thereof.

* * * * *

UNITED STATES PATENT AND TRADEMARK OFFICE
CERTIFICATE OF CORRECTION

PATENT NO. : 6,592,776 B1  Page 1 of 1
DATED : July 15, 2003
INVENTOR(S) : Shumin Wang et al.

It is certified that error appears in the above-identified patent and that said Letters Patent is hereby corrected as shown below:

<u>Column 8,</u>
Line 8, the term "wafer" should read -- the wafer. --.
Line 55, the term "methacrylsilanes" should read -- methacrylsilanes, --.
Line 63, the phrase "each be" should read -- each --.

Signed and Sealed this

Seventh Day of October, 2003

JAMES E. ROGAN
*Director of the United States Patent and Trademark Office*